United States Patent [19]

Gruen

[11] Patent Number: 5,209,916
[45] Date of Patent: May 11, 1993

[54] CONVERSION OF FULLERENES TO DIAMOND

[76] Inventor: Dieter M. Gruen, 1324 59th St., Downers Grove, Ill. 60515

[21] Appl. No.: 797,590

[22] Filed: Nov. 25, 1991

[51] Int. Cl.$^5$ .............................................. C01B 31/06
[52] U.S. Cl. ........................... 423/446; 156/DIG. 68; 204/157.47; 427/460
[58] Field of Search .................. 427/37, 38, 249, 460; 204/157.15, 157.4, 157.41, 157.44, 157.47; 423/440, 446, 460, 900; 156/DIG. 68; 51/307; 501/86, 87

[56] References Cited

U.S. PATENT DOCUMENTS 4,629,631 12/1986 Dearnaley ............................... 427/38

OTHER PUBLICATIONS

Parker et al., *Journal of American Chemical Society*, vol. 113, p. 7499 Sep. 25, 1991.
Wurz et al, *Journal of Chemical Physics*, vol. 95 p. 7008 Nov. 1, 1991.
Wang et al, *Inorganic Chemistry*, vol. 30, No. 14, (1991) no month available.
Wasielewski et al, *Journal of American Chemical Society* vol. 113, p. 2774, (1991), no month available.
Lykke et al, *Materials Research Symposium*, vol. 206 p. 679 (1991), no month available.
*Nature*, 347, "Solid $C_{60}$: a new form of Carbon", Kratschmer et al., pp. 354–358, Sep. 27, 1990.
*Popular Science*, "Buckyball The Magic Molecule", Edelson, pp. 52–87, Aug. 1991.
*Journal of Chemical Physics*, "Laser deposition of carbon clusters on surfaces: A new approach to the study of Fullerenes", Meijer et al pp. 7800–7802 Dec. 1, 1990.
*Journal of Physical Chemistry*, 95, "Resilience of All-Carbon Molecules . . . " Beck et al. pp. 8402–8409, Oct. 17, 1991.
"When Diamonds Met Buckyballs", *Science*, vol. 254, Nov. 8, 1991, p. 800.
Meilunas et al., *Applied Physics Letters*, vol. 59, No. 26 Dec. 23, 1991, pp. 3461–3463.

*Primary Examiner*—Gary P. Straub
*Assistant Examiner*—Stephen G. Kalinchak
*Attorney, Agent, or Firm*—Reinhart, Boerner, Van Deuren, Norris & Rieselbach

[57] ABSTRACT

A method of forming synthetic diamond on a substrate is disclosed. The method involves providing a substrate surface covered with a fullerene or diamond coating, positioning a fullerene in an ionization source, creating a fullerene vapor, ionizing fullerene molecules, accelerating the fullerene ions to energies above 250 eV to form a fullerene ion beam, impinging the fullerene ion beam on the substrate surface and continuing these steps to obtain a diamond thickness on the substrate.

4 Claims, No Drawings

CONVERSION OF FULLERENES TO DIAMOND

BACKGROUND OF THE INVENTION

The present invention relates generally to methods for the conversion of fullerenes to diamond or diamond films. More particularly, the invention is concerned with the manufacture of nonhydrogenic fullerenes as precursors for the synthesis of diamond or diamond-like films. Because of their thermodynamic instability with respect to diamond, the conversion of fullerenes to diamond has significant advantages over presently used methods for producing synthetic diamonds.

The prior art methods of manufacturing diamond can be divided into two main approaches. In the first or high-pressure method, graphite powder is heated to about 1500° C. under 60 kbar of pressure in the presence of an iron catalyst. Under this extreme, but equilibrium, condition of pressure and temperature, graphite can be converted to diamond. About 75 tons of diamond are produced industrially each year in this way. The second or low pressure method of producing diamond artificially involves producing a mixture usually of a few percent of methane in hydrogen gas. A hot filament or a microwave discharge is used to dissociate the methane molecule to form the methyl radical, $CH_3$, and the hydrogen molecule is dissociated to form hydrogen atoms. Diamond or diamond-like films can be grown this way epitaxially on diamond nuclei. Such films, however, always contain small contaminating amounts (0.1-1%) of hydrogen which are undesirable for many applications.

The usefulness and novelty of fullerene precursors for diamond synthesis stem from several of their properties: Fullerene precursors are thermodynamically unstable with respect to diamond and, therefore, stable only in a kinetic sense. In addition, since the fullerenes are molecular entities, they are volatile with $C_{60}$ having a vapor pressure of $10^{-4}$ Torr at 500° C. Fullerenes are also allotropes of carbon; that is, they contain no hydrogen; and therefore, diamonds produced from fullerene precursors are hydrogen-defect free. Another useful characteristic of fullerene is the chemical bond in $C_{60}$ is intermediate between graphite ($sp^2$) and diamond ($sp^3$). Furthermore, fragmentation involving carbon-carbon bond breakage occurs via the elimination of $C_2$ groups. Recent scanning tunneling microscope studies have shown $C_2$ groups to be intimately involved in the growth of epitaxial diamond films, particularly of the "dimer rows" of the $2 \times 1$ reconstructed <100> surface. It has also been determined both the positive $C_{60}^+$ and negative $C_{60}^-$ ions are stable entities that can be accelerated to kilovolt energies under an applied electrostatic potential. The so-called LUMO (lowest unoccupied molecular orbital) of the fullerenes also is an antibonding three-fold degenerate orbital that can accept up to six electrons from electron donors such as the alkali metals. The resultant repulsion between the delocalized electrons weakens the carbon-carbon bonds of the $C_{60}$ cage and provides a mechanism for the fullerene to undergo diamond transformation.

OBJECTS OF THE INVENTION

It is therefore an object of the invention to provide a novel method of making fullerene precision materials for the synthesis of diamonds and diamond films.

It is another object of the invention to provide a new method of converting condensed phase fullerenes to diamond by the application of heat and pressure but at lower temperatures and pressures than used in the conversion of graphite to diamond.

It is a further object of the invention to provide an improved method of applying heat and pressure to fullerenes in the presence of alkali or alkaline earth metals, such as potassium or calcium or other elements that act as charge transfer or complexing agents, to facilitate the conversion of condensed phase fullerenes to the diamond phase under milder conditions than those required for the transformation of graphite to diamond.

It is an additional object of the invention to provide a new method of growing diamond films on diamond nuclei by decomposing fullerene vapor onto heated substrates.

It is another object of the invention to provide a novel method of growing diamond films on diamond nuclei by decomposing fullerene vapor onto heated substrates in the presence of alkali or alkaline earth metal vapors.

It is a further object of the invention to provide an improved method of implanting kilovolt energy ionized fullerene molecules on surfaces so that fragmentation and carbon carbon bond breakage occurs with resultant diamond growth on diamond or fullerene nuclei.

It is an additional object of the invention to provide a new method of implanting multikilovolt fullerene ions to form refractory metal surfaces and subsurface carbides.

Other objects, features and advantages of the present invention will be readily apparent from the following description of the preferred embodiments thereof, taken in conjunction with the accompanying drawings described below wherein like elements have like numerals throughout the several views.

DESCRIPTION OF PREFERRED EMBODIMENTS

Diamond can be formed using compounds of the alkali metals with $C_{60}$ (e.g., $K_3C_{60}$, $K_4C_{60}$, $K_6C_{60}$). These carbon-alkali metals are mixed with conventional diamond powder and placed in a molybdenum or tantalum container that is sealed by electron beam welding in an inert atmosphere. The capsule is placed in a tetrahedral anvil apparatus and subjected to pressures of 5-20 kbar and temperatures of 500°-1000° C. These conditions are maintained for 1-10 hours after which the pressure and temperature are lowered to ambient conditions. The container is then removed, and the mixture of diamond, unreacted $C_{60}$ and excess potassium placed in a vessel. Heating the vessel to 500° C. in a vacuum sublimes out the $C_{60}$ and potassium, leaving diamond behind. A commercially more economical procedure is to substitute a mixture of $C_{60}$ and $C_{70}$ for pure $C_{60}$, and the same results can be achieved.

In another form of the invention, compounds of the alkali metals with $C_{60}$ (e.g., $K_3C_{60}$, $K_4C_{60}$, $K_6C_{60}$) are combined in a suitable refractory vessel, or container, such as Ta or Mo, with a diamond seed crystal. The seed crystal is disposed on a heater button or platform with power supplied by a separate power supply. The vessel is then placed in a furnace and heated in the furnace to a temperature of 500°-700° C. The diamond seed crystal is heated by the separate power supply to 1000°-1200° C. In the vapor phase, charge transfer from the alkali metal atoms to $C_{60}$ produces $C_6^-$ which converts to diamond epitaxially on the seed crystal. Growth is continued until the diamond crystal has reached the desired size.

In a further form of the invention positive or negative ions of $C_{60}$, $C_{70}$ or higher fullerenes or mixtures of fullerenes are produced in a conventional ion source. Well-known methods for producing the ions can be used: laser ablation, electron attachment, electron bombardment or photoionization. A means is provided for electrostatically accelerating the ions to kilovolt energies. A variety of commercially available ion sources, including ion implanters, can be used for this purpose. Because there is only one positive charge per $C_{60}$ or $C_{70}$ molecule, space charge limitations are overcome; and fullerene ion currents can be obtained which are about two orders of magnitude larger than equivalent carbon ion currents using graphite as the source of carbon. Bombardment of surfaces covered with diamond nuclei or fullerene coatings with fullerene ions having energies from about 250 eV to about 2.5 KeV results in the formation of diamond films. Bombardment of surfaces, and particularly refractory metal surfaces, such as tungsten, with fullerene ions having energies from about 2.5 keV to at least about 250 MeV results in implantation of carbon and the formation of surface or subsurface carbides. The following nonlimiting examples illustrate other features of the invention.

EXAMPLE I

Fullerenes with formulas $C_{60}$ to $C_{266}$ were prepared in a plasma arc discharge between graphite electrodes. Almost one-third of the material extractable with toluene and higher boiling point organic solvents is composed of $C_{84}$ to $C_{200}$. The fullerene compositions were characterized by conventional mass spectrometric measurements.

EXAMPLE II

Potassium-$C_{60}$ compounds were synthesized using plasma arc discharge produced soot which was processed by solvent extraction and exchange column liquid chromatography to produce pure $C_{60}$. The preparation was carried out with a conventional Schlenk apparatus. Small potassium (K) chips were added to a solution of $C_{60}$ in toluene and reacted for two hours. The black precipitate that formed was filtered off, placed on a stainless steel sample mount, and inserted into a laser desorption time-of-flight mass spectrometer. No $C_{60}+$ was seen which is in contrast to the positive ion spectrum from the original $C_{60}$ sample. Thus, $K_xC_{60}$ has formed an ion-like bonding with the $C_{60}$ forming the anion and the K, the cation.

EXAMPLE III

The above mentioned conventional ion producing and ion accelerating mass spectrometer has also been used to characterize the photoionization and photofragmentation of $C_{60}$ and $C_{70}$. Photoionization performed without fragmentation to produce $C_{60}+$ from neutral $C_{60}$ molecules was accomplished by using laser beam photons of 10.5 eV, approximately 3 eV above the ionization potential of $C_{60}$. The photoions were accelerated to several keV and detected by a channel-plate detector. By increasing laser powers to higher intensities, various photofragments were produced. These photofragments included $C_{58}$, $C_{56}$... $C_{32}$... $C_{10}$, $C_8$, ... C. Thus, the higher the laser power, the lower the nuclearity of the carbon cluster that is produced.

What is claimed is:

1. A method of forming synthetic diamond on a coated substrate surface having an initial coating selected from the group consisting of fullerene and diamond comprising the step of:
    (a) supplying fullerenes to an ionization source;
    (b) creating a vapor of said fullerenes by heating said fullerenes in said ionization source in a vacuum chamber;
    (c) ionizing fullerene molecules in said vapor of fullerenes by at least one of the procedures of laser ablation, electron bombardment, electron attachment or photoionization to fullerene ions;
    (d) accelerating said fullerene ions to energies of about 250 eV to 2.5 keV to form a fullerene ion beam;
    (e) impinging said fullerene ion beam on said substrate surface and fragmenting said fullerene ions; and
    (f) continuing said steps (a)-(e) to grow a diamond film on said coated substrate surface.

2. The method as defined in claim 1 wherein said substrate surface is maintained at a temperature of about 50°-500° C.

3. The method as defined in claim 1 wherein said fullerene in said step (b) is heated to about 500°-600° C.

4. A method of forming synthetic diamond on a substrate surface having an initial coating selected from the group consisting of fullerene and diamond comprising the steps of:
    (a) supplying fullerenes to an ionization source;
    (b) creating a vapor of said fullerenes from said fullerenes positioned in said ionization source;
    (c) ionizing fullerene molecules in said vapor of fullerenes to form fullerene ions;
    (d) accelerating said fullerene ions to energies of at least about 250 eV to form a fullerene ion beam;
    (d) impinging said fullerene ion beam on said coated substrate surface; and
    (f) continuing said steps (a)-(e) to obtain grow a diamond film on said coated substrate surface.

* * * * *

UNITED STATES PATENT AND TRADEMARK OFFICE
CERTIFICATE OF CORRECTION

PATENT NO. : 5,209,916
DATED : May 11, 1993
INVENTOR(S) : Dieter M. Gruen

It is certified that error appears in the above-identified patent and that said Letters Patent is hereby corrected as shown below:

Column 2, Line 25, after "carbon" in the first occurrence, insert a hyphen ( - );

Column 2, Line 52, cancel "uncreacted" and insert -- unreacted --;

Column 4, Line 21, cancel "step" and insert -- steps --;

Column 4, Line 29, before "fullerene" insert -- form --;

Column 4, Line 55, cancel "obtain".

Signed and Sealed this

Twenty-sixth Day of December, 1995

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,209,916
DATED : May 11, 1993
INVENTOR(S) : Dieter M. GRUEN

It is certified that error appears in the above-indentified patent and that said Letters Patent is hereby corrected as shown below:

In Column 1, immediately below the title "CONVERSION OF FULLERENES TO DIAMOND" insert the following paragraph:

--This invention was made with Government support under Contract No. W-31-109-ENG-38 between the University of Chicago and the U.S. Department of Energy. The Government has certain rights in this invention.--.

Signed and Sealed this

Sixth Day of May, 1997

*Attest:*

BRUCE LEHMAN

*Attesting Officer*  Commissioner of Patents and Trademarks